United States Patent
Chang et al.

(10) Patent No.: US 9,030,473 B2
(45) Date of Patent: May 12, 2015

(54) COMPUTING DEVICE AND METHOD FOR DETERMINING DISTANCE BETWEEN TWO CURVED SURFACES

(75) Inventors: Chih-Kuang Chang, New Taipei (TW); Xin-Yuan Wu, Shenzhen (CN); Min Wang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 452 days.

(21) Appl. No.: 13/480,481

(22) Filed: May 25, 2012

(65) Prior Publication Data

US 2013/0083019 A1    Apr. 4, 2013

(30) Foreign Application Priority Data

Sep. 30, 2011    (CN) .......................... 2011 1 0293999

(51) Int. Cl.
| G06T 17/20 | (2006.01) |
| G06T 7/00 | (2006.01) |
| G06F 17/20 | (2006.01) |
| G01B 5/14 | (2006.01) |
| G06F 17/50 | (2006.01) |

(52) U.S. Cl.
CPC ................. *G06T 7/001* (2013.01); *G06F 17/50* (2013.01); *G06F 17/20* (2013.01); *G01B 5/14* (2013.01); *G06T 2207/30164* (2013.01)

(58) Field of Classification Search
None
See application file for complete search history.

(56) References Cited

U.S. PATENT DOCUMENTS

| 8,237,706 | B2 * | 8/2012 | Lee et al. ....................... 345/420 |
| 2009/0058853 | A1 * | 3/2009 | Chang et al. .................. 345/423 |
| 2010/0076738 | A1 * | 3/2010 | Dean et al. ........................ 703/7 |

* cited by examiner

*Primary Examiner* — Daniel Hajnik
*Assistant Examiner* — Andrew G Yang
(74) *Attorney, Agent, or Firm* — Novak Druce Connolly Bove + Quigg LLP

(57) ABSTRACT

A computing device reads information in relation to a first curved surface and a second curved surface from a storage device, respectively meshes the first and second curved surfaces into a plurality of first and second triangles, and divides a parametric plane associated into a plurality of first grids, where each first grid corresponds to a small box in 3D space. The device determines associations between the first/second triangles of the two curved surfaces and the small boxes in the 3D space, determines a second triangle that is nearest to each first triangle of the first curved surface, and determines a distance between the first triangle and the second triangle as a minimum distance from the first triangle to the second curved surface. A minimum value from all of the minimum distances is determined as a minimum distance between the first curved surface and the second curved surface.

15 Claims, 11 Drawing Sheets

COMPUTING DEVICE AND METHOD FOR DETERMINING DISTANCE BETWEEN TWO CURVED SURFACES

CROSS REFERENCE TO RELATED APPLICATIONS

This application is related to U.S. patent application Ser. No. 12/577,260 (filed Oct. 12, 2009) and U.S. patent application Ser. No. 13/217,287 (filed Aug. 25, 2011), the disclosure in the two related applications is incorporated herein by reference.

BACKGROUND

1. Technical Field

Embodiments of the present disclosure relates to computer aided design (CAD) methods, and more particularly to, and particularly, to a computing device and a method for measuring curved surfaces.

2. Description of Related Art

A three-dimensional (3D) measurement machine is widely used to measure a shape of a product. Such 3D measurement machine measures a set of spatial coordinates of points on the product by contacting a probe on a curved surface of the product, and capturing the curved surface based on the coordinates. The captured curved surface and a standard curved surface defined by a CAD model of the product are compared, so as to determine a precision of product or the CAD model of the product. Due to irregularity and freedom of the curved surfaces, no mathematical formula can be directly used to determined deviations between two curved surfaces.

DETAILED DESCRIPTION

The disclosure, including the accompanying drawings in which like references indicate similar elements, is illustrated by way of examples and not by way of limitation. It should be noted that references to "an" or "one" embodiment in this disclosure are not necessarily to the same embodiment, and such references mean at least one.

In general, the word "module", as used herein, refers to logic embodied in hardware or software, or to a collection of software instructions, written in a programming language, such as, Java, C, or assembly. One or more software instructions in the modules may be embedded in firmware, such as in an erasable programmable read only memory (EPROM). The modules described herein may be implemented as either software and/or hardware modules and may be stored in any type of non-transitory computer-readable medium or other storage device. Some non-limiting examples of non-transitory computer-readable media include CDs, DVDs, BLU-RAY, flash memory, and hard disk drives.

Figure 1:
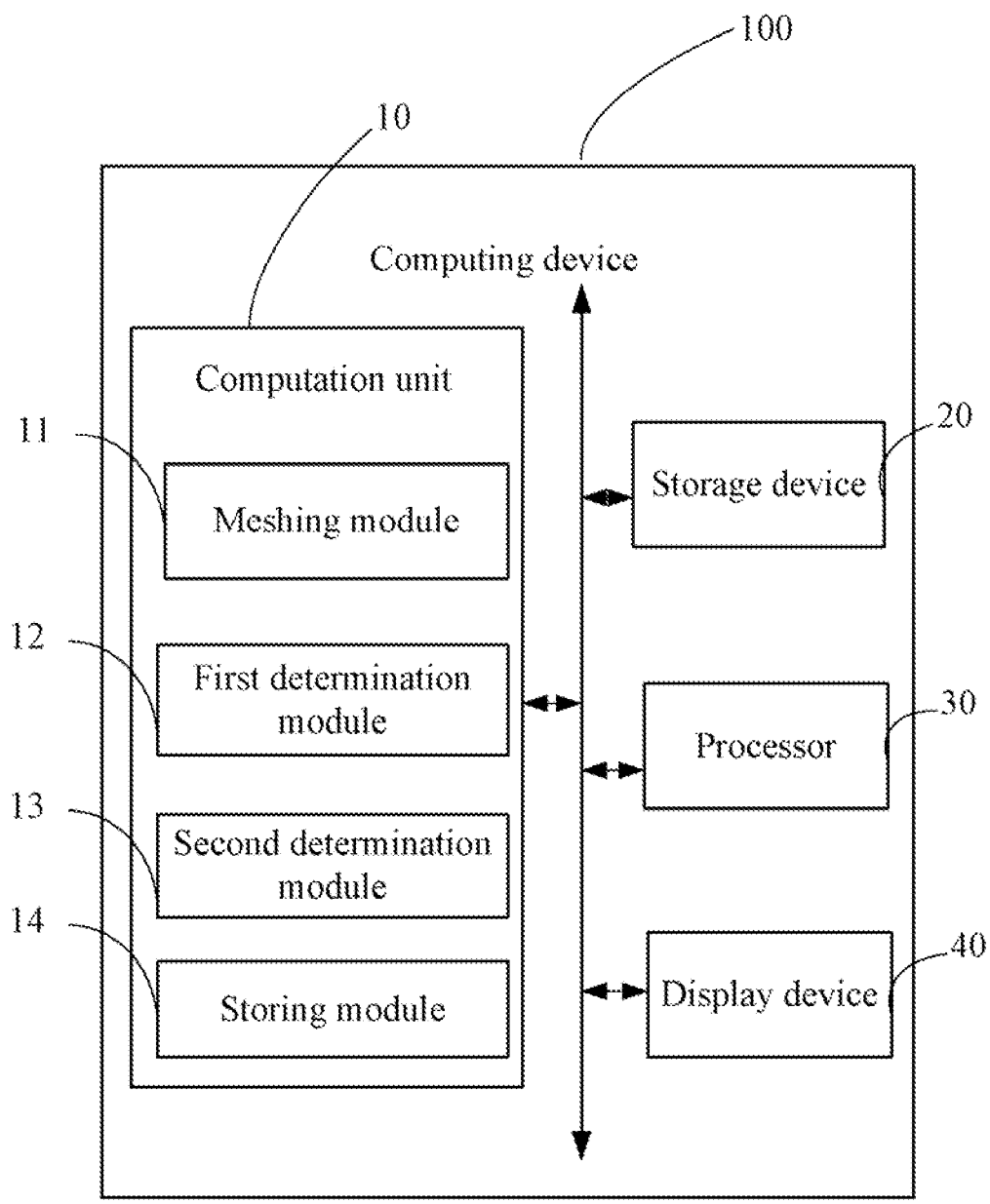
FIG. 1 is a block diagram of one embodiment of a computing device including a computation unit for determining distances between two curved surfaces.

FIG. 1 is a block diagram of one embodiment of a computing device 100 including a computation unit 10 for determining distances between two curved surfaces. The computing device 100 may be a computer, or any other electronic device having data processing functions. As shown in FIG. 1, the computation unit 10 includes a meshing module 11, a first determination module 12, a second determination module 13, and a storing module 14. The modules 11-14 may comprise computerized code in the form of one or more programs (computer-readable program code) that are stored in a storage device 20 of the computing device 100. The computerized code includes instructions that are executed by a processor 30 of the computing device 10 to determine distances between two curved surfaces. Functions of the modules 11-14 are referred to description regarding FIG. 2-FIG. 5. The storage device 20 may be a dedicated memory, such as an EPROM, a hard disk driver (HDD), or a flash memory. The computing device 100 further includes a display device 40 that displays the curved surfaces.

Figure 2:
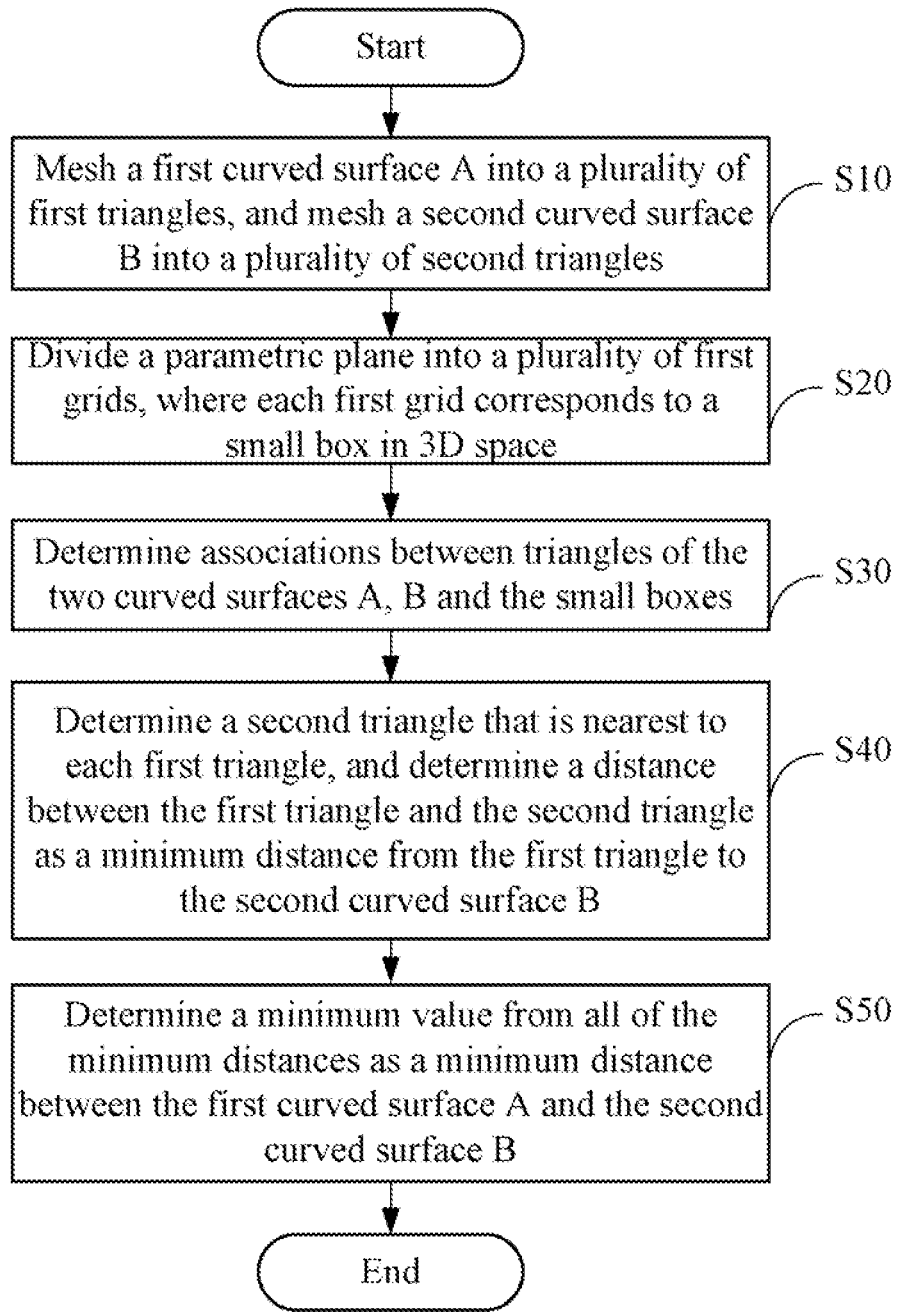
FIG. 2 is a flowchart of one embodiment of a method for determining distances between two curved surfaces.

FIG. 2 is a flowchart of one embodiment of a method for determining distances between two curved surfaces. Depending on the embodiment, additional steps may be added, others removed, and the ordering of the steps may be changed.

Figure 6:
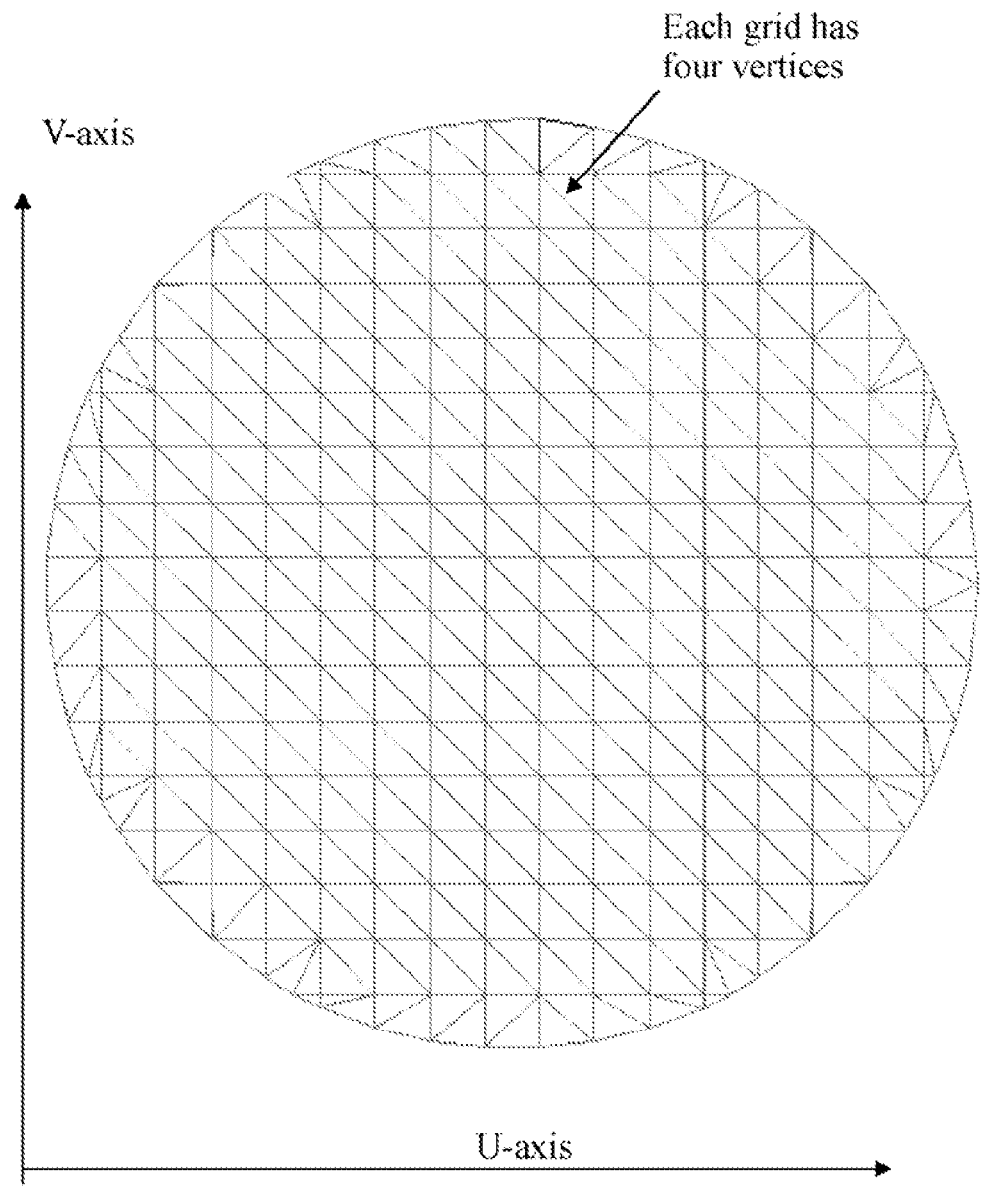
FIG. 6 and FIG. 7 illustrate meshing a curved surface.
Figure 8:
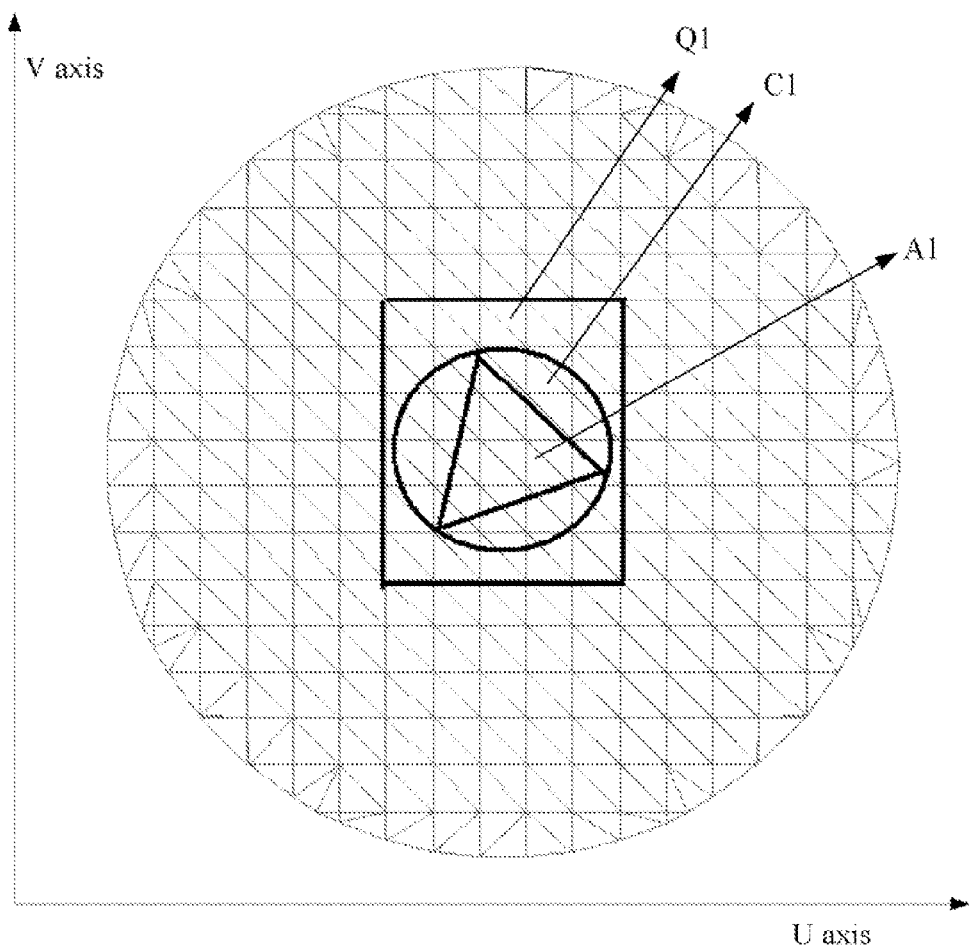
FIG. 8, FIG. 9, and FIG. 10 illustrate determining small boxes in space that have no association with triangles of a curved surface.

In step S10, the meshing module 11 reads information in relation to two curved surfaces, such as a first curved surface A and a second curved surface B, from the storage device 20. The meshing module 11 then respectively meshes the two curved surfaces into a plurality of triangles (a detailed description is given in FIG. 3). In one embodiment, the information in relation to a curved surface includes a parametric equation (i.e. $x=j(u,v)$, $y=\psi(u,v)$, $0<u,v<=1$) of the curved surface and a 3D model of the curved surface. In this embodiment, a U-axis represents a horizontal direction on a parametric plane, and a V-axis represents a vertical direction on the parametric plane (as shown in FIG. 6 and FIG. 8). Vertices on the meshed curved surface may be expressed by 3D coordinates x, y, and z, or be expressed by the 2D parameters u and v.

In one embodiment, the triangles of the first curved surface are called as first triangles, and the triangles of the second curved surface are called as second triangles. The first curved surface is a standard curved surface designed for a product (such as a back cover of a mobile phone), the second curved surface is the actual back cover of the mobile phone. In other embodiments, the first and second curved surfaces may be in relation to different objects, such as a probe installed on a measurement machine and a work plane of the measurement machine.

In step S20, the meshing module 11 divides the parametric plane associated with the parametric equations into a plurality of first grids (as shown in FIG. 6). In one embodiment, each first grid in the parametric plane corresponds to a cube in the 3D space that has the same side length as the first grid. Hereinafter, the cube in the 3D space is referred to as a small box.

In step S30, the first determination module 12 determines associations between triangles of the two curved surfaces and the small boxes. The associations include whether a small box intersects with a triangle of the two curved surface or is completely enclosed within (hereinafter "fall within") the triangle. A detailed description of step S30 is given in FIG. 4.

In step S40, the second determination module 13 determines a second triangle that is nearest to each first triangle of the first curved surface A, and determines a distance between the first triangle and the second triangle as a minimum distance from the first triangle to the second curved surface B. A detailed description of step S40 is given in FIG. 5.

In step S50, the second determination module 13 determines a minimum value from all of the minimum distances as a minimum distance between the first curved surface A and the second curved surface B. The storing module 15 stores data in relation to the distances, such as the minimum distances from each first triangle of the first curved surface A to the second curved surface B, and the minimum distance between the first curved surface A and the second curved surface B, into the storage device 20.

Figure 3:
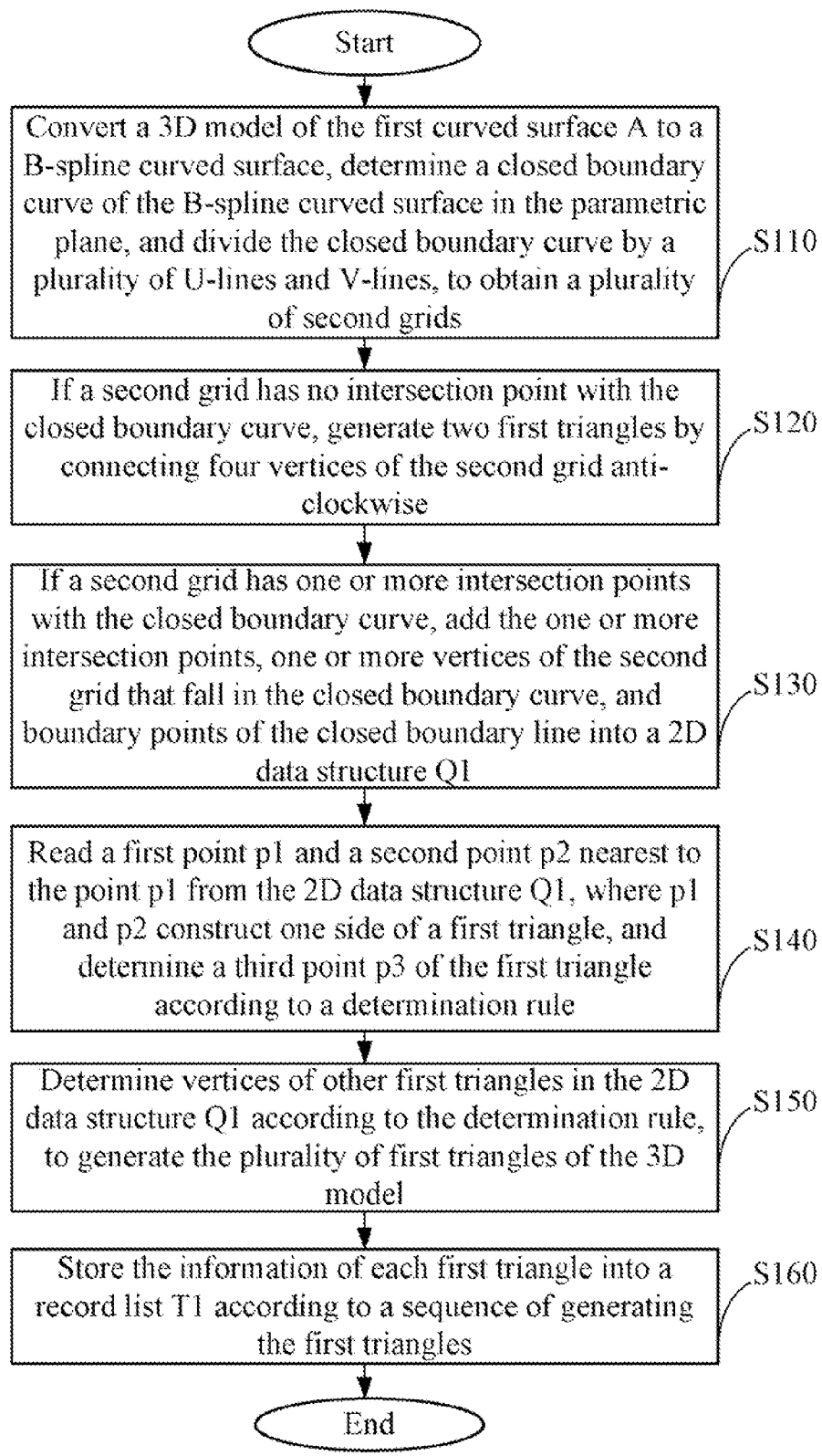
FIG. 3 is a detailed description of step S10 in FIG. 2.

FIG. 3 is a detailed description of step S10 in FIG. 2. This embodiment takes the first curved surface A as an example of meshing triangles, and the meshing the second curved surface is similar to the meshing of the first curved surface. Depending on the embodiment, additional steps may be added, others removed, and the ordering of the steps may be changed.

In step S110, the meshing module 11 converts a 3D model of the first curved surface A into a B-spline curved surface, determines a closed boundary curve of the B-spline curved surface in a parametric plane, and divides the closed boundary curve by a plurality of horizontal lines (hereinafter referred to as "U-lines") and vertical lines (hereinafter referred to as "V-lines"), to obtain a plurality of second grids (as shown in FIG. 6). A second grid may have a different side length or the same side length as the first grids generated at step S20 in FIG. 2, and in this embodiment, the side length of the second grid is more than the side length of the first grid.

Figure 7:
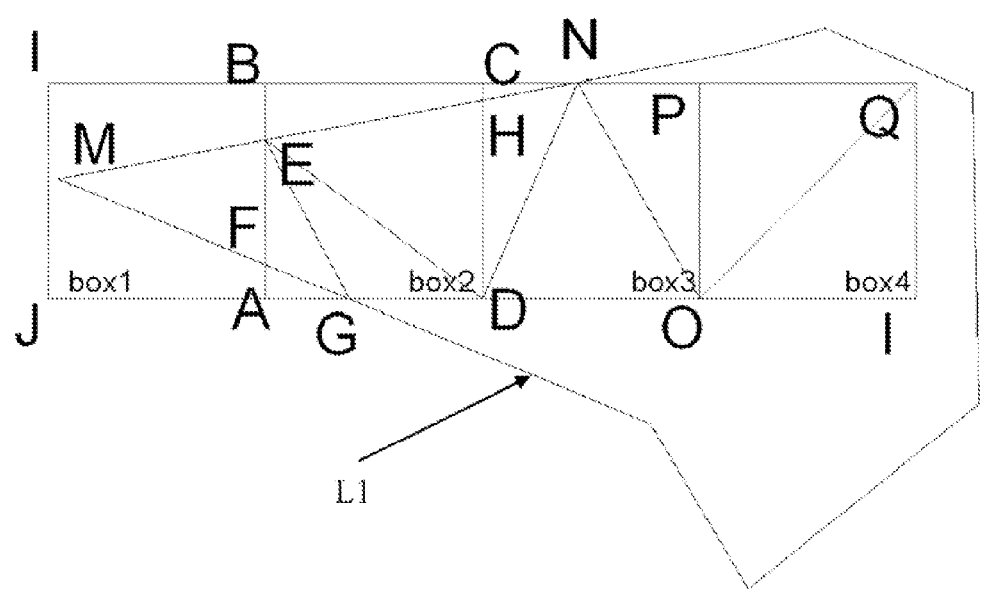

In step S120, if a second grid has no intersection point with the closed boundary curve, the meshing module 11 generates two first triangles by connecting four vertices of the second grid anti-clockwise. For example, as shown in FIG. 7, four vertices "P," "Q," "I," and "O" of a second grid "box4" all fall within the closed boundary curve L1, then the meshing module 11 generates two first triangles "OQP" and "OIQ" by connecting the four vertices "P," "Q," "I," and "O" anti-clockwise.

In step S130, if a second grid has one or more intersection points with the closed boundary curve, the meshing module 11 adds the one or more intersection points, one or more vertices of the second grid which fall within the closed boundary curve, and boundary points of the closed boundary line into a two-dimensional (2D) data structure Q1. For example, as shown in FIG. 7, a boundary point "M" falls within a second grid "box1," and the second grid "box1" has two intersection points "E" and "F" with the closed boundary curve L1. A vertex "D" of a grid "box2" falls within the closed boundary curve L1, and the second grid "box2" has four vertices "E," "F," "C," and "G" with the closed boundary curve L1. Then, the meshing module 11 adds the points "M," "E," "F," "C," "D," and "G" into the 2D data structure Q1.

In step S140, the meshing module 11 reads a first point p1 and a second point p2 nearest to the point p1 from the 2D data structure Q1, where p1 and p2 construct one side of a first triangle A1. The meshing module 11 further determines a third point p3 of the first triangle A1 according to a determination rule that there is no 2D point of the 2D data structure Q1 in a circumcircle of the first triangle A1 consisting of the points p1, p2, and p3.

In step S150, the meshing module 11 determines vertices of other first triangles in the 2D data structure Q1 according to the determination rule, to generate the plurality of first triangles of the first curved surface A.

In step S160, the meshing module 11 stores the information of each first triangle into a record list T1 according to a sequence of generating the first triangles. Similarly, a record list T2 in relation to the second curved surface B can be generated.

Figure 4:
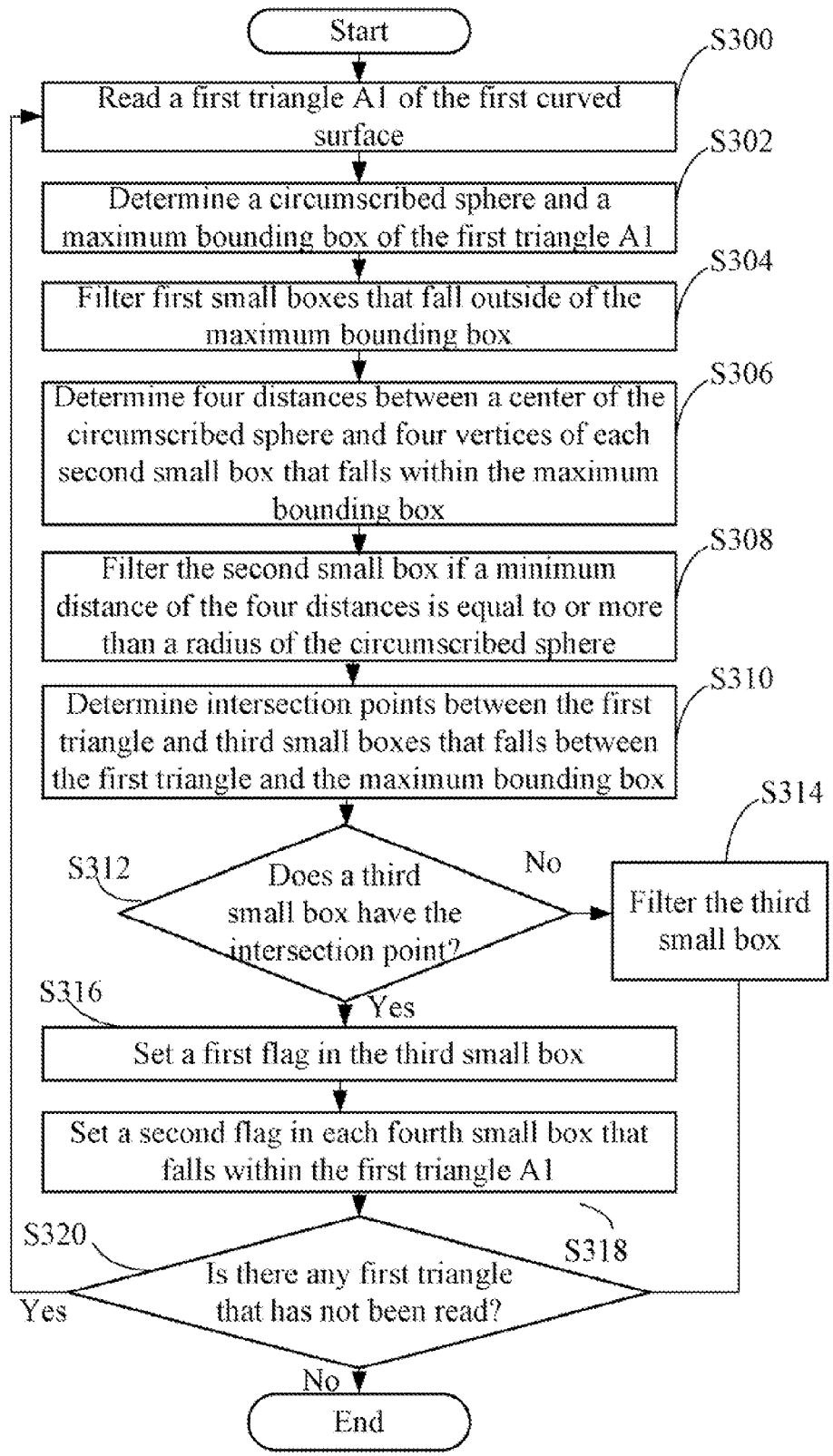
FIG. 4 is a detailed description of step S30 in FIG. 2.

FIG. 4 is a detailed description of step S30 in FIG. 2. Depending on the embodiment, additional steps may be added, others removed, and the ordering of the steps may be changed.

In step S300, the first determination module 12 reads a first triangle A1 from the record list T1.

In step S302, the first determination module 12 determines a circumscribed sphere C1 and a maximum bounding box Q1 of the first triangle A1 (as shown in FIG. 8). In this embodiment, the maximum bounding box Q1 of the first triangle A1 is defined as a cuboid that surrounds the first triangle A1, and the first triangle A1 still falls within the cuboid no matter how the first triangle A1 is rotated by taking any point on the first triangle A1 as the pivot point.

Figure 9:
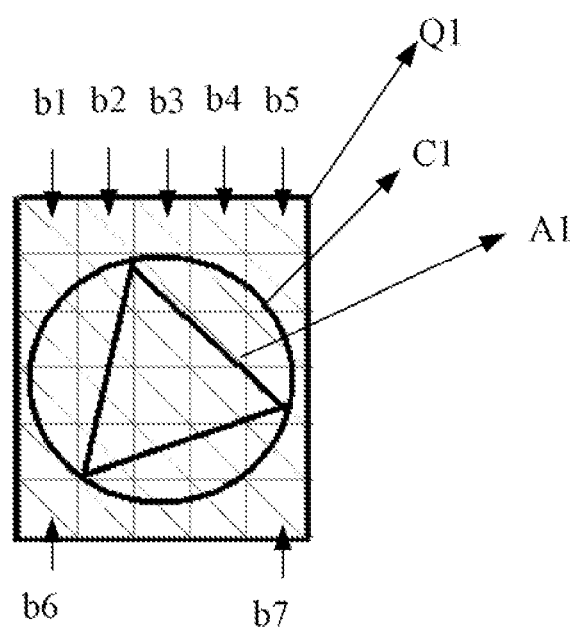

In step S304, the first determination module 12 filters first small boxes that fall outside of the maximum bounding box Q1. The first small boxes are determined as do not intersect with the first triangle A1, thus are filtered (e.g., removed and/or ignored). For example, after filtering the first small boxes that fall outside the maximum bounding box Q1, remaining small boxes are shown in FIG. 9.

In step S306, the first determination module 12 determines four distances between a center of the circumscribed sphere C1 and four vertices of each second small box that falls within the maximum bounding box Q1. For example, as shown in FIG. 9, four distances d1, d2, d3, and d4 between the center of the circumscribed sphere C1 and the four vertices of a second small box within the maximum bounding box Q1 is determined.

In step S308, the first determination module 12 determines that the second small box does not intersect with the first triangle A1 and filters the second small box, if a minimum distance of the four distances is equal to or more than a radius of the circumscribed sphere C1. If the minimum distance of the four distances is equal to or more than the radius of the circumscribed sphere C1, the first determination module 12 determines that the second small box does not intersect with the first triangle A1, so the second small box is filtered. For example, as shown in FIG. 9, the minimum distances between the center of the circumscribed sphere C1 and the small boxes b1-b7 is more than the radius of the circumscribed sphere Q1, therefore the small boxes b1-b7 are filtered.

In step S310, the first determination module 12 computes intersection points between the first triangle A1 and third small boxes that falls between the first triangle A1 and the maximum bounding box Q1.

Figure 10:
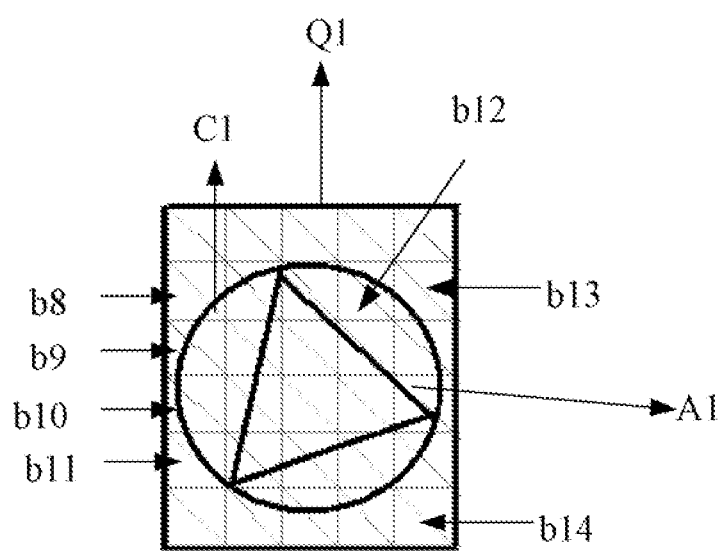

In step S312, the first determination module 12 determines if each third box, which falls between the first triangle A1 and the maximum bounding box Q1, has an intersection point with the first triangle A1. If a third box has no intersection point with the first triangle A1, in step S314, the third box is determined as not intersect with the first triangle A1 and is filtered. For example, as shown in FIG. 10, the small boxes b8-b14, which fall between the first triangle A1 and the maximum bounding box Q1, have no intersection points with the first triangle A1, thus are filtered. Then, the procedure goes to step S320. Otherwise, if a third box has an intersection point with the first triangle A1, step S316 is implemented.

In step S316, the first determination module 12 sets a first flag in the third small box that has an intersection point with the first triangle A1. For example, the first flag may be set as "A1+f1."

In step S318, the first determination module 12 sets a second flag in each fourth small box that falls within the first triangle A1. For example, the second flag may be set as "A1+f2."

In step S320, the first determination module 12 determines if there is any other first triangle in the record list T1 that has not been read. If there is any other first triangle in the record list T1 that has not been read, the procedure repeats from step S300, until the associations between each first triangle of the first curved surface A and the small boxes have been determined. Similarly, the associations between each second triangle of the second curved surface B and the small boxes are determined.

Figure 5:
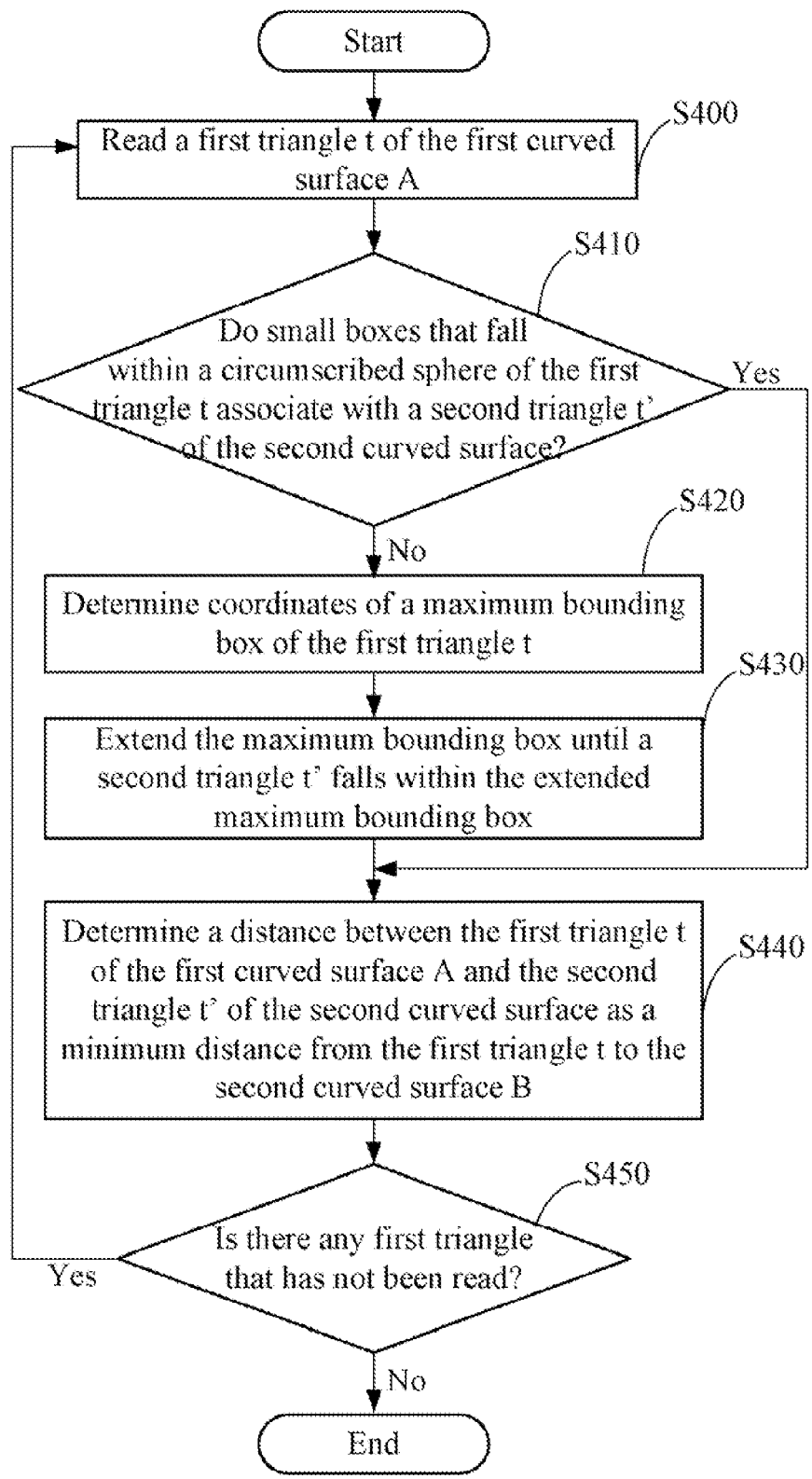
FIG. 5 is a detailed description of step S40 in FIG. 2.

FIG. 5 is a detailed description of step S40 in FIG. 2. Depending on the embodiment, additional steps may be added, others removed, and the ordering of the steps may be changed.

In step S400, the second determination module 13 reads a first triangle t of from the record list T1 of the first curved surface A.

Figure 11:
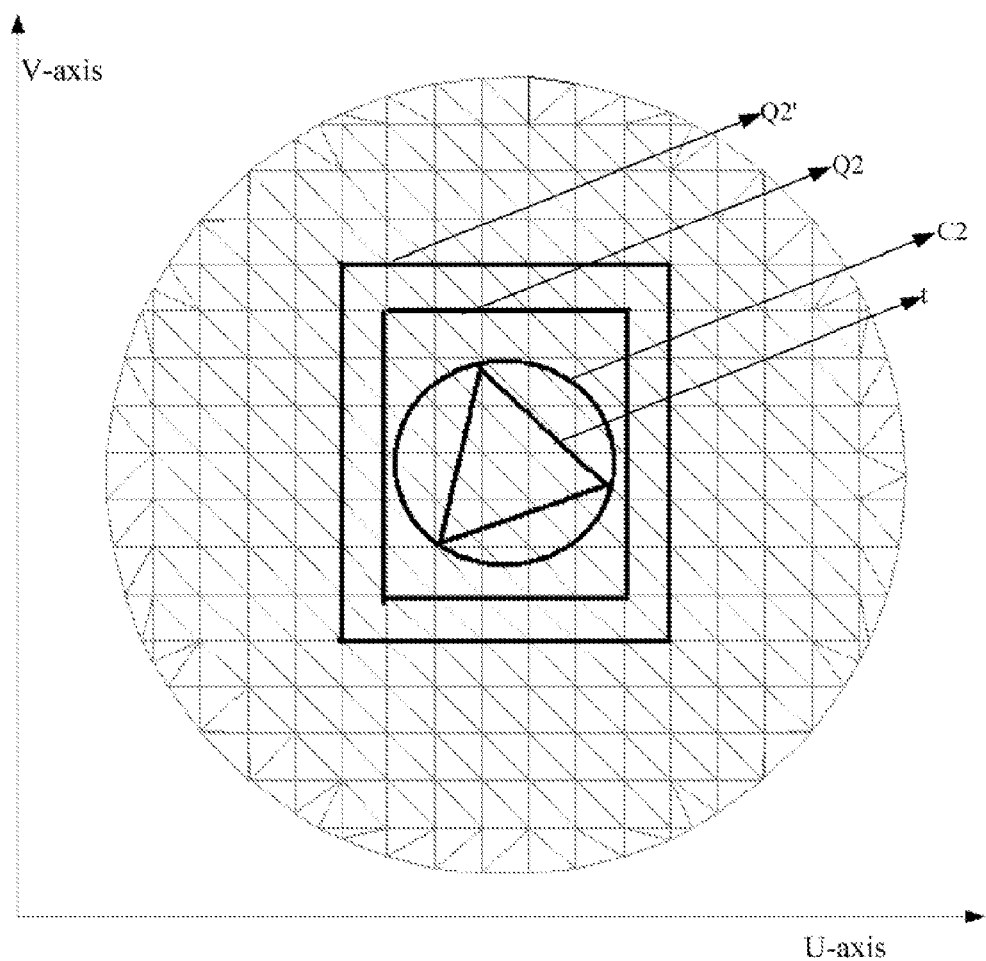
FIG. 11 illustrates extending a maximum bounding box of a triangle of a curved surface.

In step S410, the second determination module 13 determines whether small boxes, which fall within a circumscribed sphere C2 of the first triangle t (as shown in FIG. 11), associate with a second triangle t' of the second curved surface B. If a small box, which falls within a circumscribed sphere C2 of the first triangle t, associate with a second triangle t' of the second curved surface B, the second determination module 13 determines the second triangle t' is nearest to the first triangle t, and the procedure directly goes to S440 described below. Otherwise, if all of the small boxes, which fall within a circumscribed sphere C2 of the first triangle t, do not associate with any second triangle t' of the second curved surface B, step S420 is implemented.

In step S420, the second determination module 13 determines coordinates of a maximum bounding box Q2 of the first triangle t according to associations of the first triangle t and the small boxes that fall within the circumscribed sphere C2 of the first triangle t. For example, the associated small boxes (intersecting or falling within the first triangle t) are set a first flag or a second flag, therefore, the coordinates of the maximum bounding box Q2 of the first triangle t can be determined based on coordinates of vertices of the first triangle t and the associated small boxes.

In step S430, the second determination module 13 extends the maximum bounding box Q2 until a second triangle t' falls within the extended maximum bounding box Q2' (as shown in FIG. 11). For example, if minimum and maximum x, y, z coordinates of vertices of the maximum bounding box Q2 are $x_{min}$, $y_{min}$, $z_{min}$, $x_{max}$, $y_{max}$, and $z_{max}$, the second determination module 13 may extend the maximum bounding box Q2 by one layer small boxes to positive and negative directions of X, Y, Z axes, and determine minimum and maximum x, y, z coordinates of vertices of the extended maximum bounding box Q2' as $x_{min}'=x_{min}-1$, $y_{min}'=y_{min}-1$, $z_{min}'=z_{min}-1$, $x_{max}'=x_{max}+1$, $y_{max}'=y_{max}+1$, $z_{max}'=z_{max}+1$.

In step S440, the second determination module 13 determines a distance D1 between the first triangle t of the first curved surface A and the second triangle t' of the second curved surface B, and regards the distance D1 as a minimum distance from the first triangle t to the second curved surface B.

In step S450, the second determination module 13 determines if there is any other first triangle in the record list T1 that has not been read. If there is any other first triangle in the record list T1 that has not been read, the procedure repeats from step S400, until the minimum distances from each first triangle of the first curved surface A to the second curved surface B have been determined.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A method being executed by a processor of a computing device for determining distances between two curved surfaces, the method comprising:
   (a) reading information in relation to a first curved surface and a second curved surface from a storage device, meshing the first curved surface into a plurality of first triangles, and meshing the second curved surface into a plurality of second triangles based on the information, wherein the information comprises three-dimensional (3D) models and parametric equations of the two curved surfaces;
   (b) dividing a parametric plane associated with the parametric equations into a plurality of first grids, wherein each first grid in the parametric plane corresponds to a small box in 3D space, the small box having a same side length as the first grid;
   (c) determining associations between the first/second triangles and the small boxes in the 3D space, wherein the associations comprise whether one small box intersects with a first/second triangle or falls within a first/second triangle;
   (d) determining a second triangle that is nearest to each first triangle of the first curved surface, and determining a distance between the first triangle and the second triangle as a minimum distance from the first triangle to the second curved surface, wherein step (d) comprises:
      (d1) reading a first triangle of the first curved surface;
      (d2) determining whether fifth small boxes, which fall within a circumscribed sphere of the first triangle, associate with a second triangle of the second curved surface, determining a second triangle which is nearest to the first triangle and going to step (d5) if a fifth small box associates with the second triangle, or going to step (d3) if all of the fifth small boxes do not associate with any second triangle of the second curved surface;
      (d3) determining coordinates of a maximum bounding box of the first triangle according to associations of the first triangle and the fifth small boxes;
      (d4) extending the maximum bounding box until a second triangle falls within the extended maximum bounding box;
      (d5) determining a distance between the first triangle of the first curved surface and the second triangle of the second curved surface, and regarding the distance as a minimum distance from the first triangle to the second curved surface; and
      (d6) repeating from step (d1), until the minimum distances from each first triangle of the first curved surface to the second curved surface have been determined; and
   (e) determining a minimum value from all of the minimum distances as a minimum distance between the first curved surface and the second curved surface.

2. The method of claim 1, wherein step (b) comprises:
   (b1) converting a 3D model of the first curved surface to a B-spline curved surface, determining a closed boundary curve of the B-spline curved surface in the parametric plane, and dividing the closed boundary curve by a plurality of horizontal lines (U-lines) and vertical lines (V-lines), to obtain a plurality of second grids;

(b2) if a second grid has no intersection point with the closed boundary curve, generating two first triangles by connecting four vertices of the second grid anti-clockwise;

(b3) if a second grid has one or more intersection points with the closed boundary curve, adding the one or more intersection points, one or more vertices of the second grid which fall within the closed boundary curve, and boundary points of the closed boundary line into a two-dimensional (2D) data structure Q1;

(b4) reading a first point p1 and a second point p2 nearest to the point p1 from the 2D data structure Q1, wherein p1 and p2 construct one side of a first triangle A1, determining a third point p3 of the first triangle A1 according to a determination rule that there is no 2D point of the 2D data structure Q1 in a circumcircle of the first triangle A1 consisting of the points p1, p2, and p3; and (b5) determining vertices of other first triangles in the 2D data structure Q1 according to the determination rule, to generate the plurality of first triangles of the first curved surface.

3. The method of claim 1, wherein step (c) comprises:
(c1) reading a first triangle of the first curved surface;
(c2) determining a circumscribed sphere and a maximum bounding box of the first triangle;
(c3) determining first small boxes do not intersect the first triangle and filtering the first small boxes, wherein the first small boxes fall outside of the maximum bounding box;
(c4) determining four distances between a center of the circumscribed sphere and four vertices of each second small box that falls within the maximum bounding box, and determining the second small box does not intersect the first triangle and filtering the second small box, if a minimum distance of the four distances is equal to or more than a radius of the circumscribed sphere;
(c5) determining if each third box, which falls between the first triangle A1 and the maximum bounding box Q1, has an intersection point with the first triangle A1;
(c6) determining a third small box does not intersect with the first triangle and filtering the third boxes, if the third box has no intersection point with the first triangle A1, and setting a first flag in a third small box that has an intersection point with the first triangle;
(c7) setting a second flag in each of fourth small boxes that fall within the first triangle; and
(c8) repeating from step (a1), until the associations between each first triangle of the first curved surface and the small boxes have been determined.

4. The method of claim 3, wherein the maximum bounding box of the first triangle is defined as a cuboid that surrounds the first triangle, and the first triangle still falls within the cuboid no matter how the first triangle is rotated by taking any point on the first triangle as the pivot point.

5. The method of claim 1, further comprising:
storing data in relation to the associations and the distances into the storage device.

6. A computing device, comprising:
a storage device;
a processor; and
one or more programs that are stored in the storage device and executed by the processor, the one or more programs comprising instructions to:

(a) read information in relation to a first curved surface and a second curved surface from a storage device, mesh the first curved surface into a plurality of first triangles, and mesh the second curved surface into a plurality of second triangles based on the information, wherein the information comprises three-dimensional (3D) models and parametric equations of the two curved surfaces;

(b) divide a parametric plane associated with the parametric equations into a plurality of first grids, wherein each first grid in the parametric plane corresponds to a small box in 3D space, the small box having a same side length as the first grid;

(c) determine associations between the first/second triangles and the small boxes in the 3D space, wherein the associations comprise whether one small box intersects with a first/second triangle or falls within a first/second triangle;

(d) determine a second triangle that is nearest to each first triangle of the first curved surface, and determine a distance between the first triangle and the second triangle as a minimum distance from the first triangle to the second curved surface, wherein step (d) comprises:
(d1) reading a first triangle of the first curved surface;
(d2) determining whether fifth small boxes, which fall within a circumscribed sphere of the first triangle, associate with a second triangle of the second curved surface, determining a second triangle which is nearest to the first triangle and going to step (d5) if a fifth small box associates with the second triangle, or going to step (d3) if all of the fifth small boxes do not associate with any second triangle of the second curved surface;
(d3) determining coordinates of a maximum bounding box of the first triangle according to associations of the first triangle and the fifth small boxes;
(d4) extending the maximum bounding box until a second triangle falls within the extended maximum bounding box;
(d5) determining a distance between the first triangle of the first curved surface and the second triangle of the second curved surface, and regarding the distance as a minimum distance from the first triangle to the second curved surface; and
(d6) repeating from step (d1), until the minimum distances from each first triangle of the first curved surface to the second curved surface have been determined; and (e) determine a minimum value from all of the minimum distances as a minimum distance between the first curved surface and the second curved surface.

7. The computing device of claim 6, wherein the one or more programs further comprise instructions to store data in relation to the associations and the distances into the storage device.

8. The computing device of claim 6, wherein step (b) comprises:
(b1) convert a 3D model of the first curved surface to a B-spline curved surface, determine a closed boundary curve of the B-spline curved surface in the parametric plane, and divide the closed boundary curve by a plurality of horizontal lines (U-lines) and vertical lines (V-lines), to obtain a plurality of second grids;
(b2) generate two first triangles by connecting four vertices of a second grid anti-clockwise, if the second grid has no intersection point with the closed boundary curve;
(b3) add the one or more intersection points, one or more vertices of a second grid which fall within the closed boundary curve, and boundary points of the closed boundary line into a two-dimensional (2D) data structure Q1, if the second grid has one or more intersection points with the closed boundary curve;

(b4) read a first point p1 and a second point p2 nearest to the point p1 from the 2D data structure Q1, wherein p1 and p2 construct one side of a first triangle A1, determine a third point p3 of the first triangle A1 according to a determination rule that there is no 2D point of the 2D data structure Q1 in a circumcircle of the first triangle A1 consisting of the points p1, p2, and p3; and (b5) determine vertices of other first triangles in the 2D data structure Q1 according to the determination rule, to generate the plurality of first triangles of the first curved surface.

9. The computing device of claim 6, wherein step (c) comprises:

(c1) read a first triangle of the first curved surface;

(c2) determine a circumscribed sphere and a maximum bounding box of the first triangle;

(c3) determine first small boxes do not intersect the first triangle and filtering the first small boxes, wherein the first small boxes fall outside of the maximum bounding box;

(c4) determine four distances between a center of the circumscribed sphere and four vertices of each second small box that falls within the maximum bounding box, and determine the second small box does not intersect the first triangle and filtering the second small box, if a minimum distance of the four distances is equal to or more than a radius of the circumscribed sphere;

(c5) determine if each third box, which falls between the first triangle A1 and the maximum bounding box Q1, has an intersection point with the first triangle A1, (c6) determine a third small box does not intersect with the first triangle and filter the third boxes, if the third box has no intersection point with the first triangle A1, and set a first flag in a third small box that has an intersection point with the first triangle;

(c7) set a second flag in each of fourth small boxes that fall within the first triangle; and (c8) repeat from step (a1), until the associations between each first triangle of the first curved surface and the small boxes have been determined.

10. The computing device of claim 9, wherein the maximum bounding box of the first triangle is defined as a cuboid that surrounds the first triangle, and the first triangle still falls within the cuboid no matter how the first triangle is rotated by taking any point on the first triangle as the pivot point.

11. A non-transitory storage medium storing a set of instructions, the set of instructions capable of being executed by a processor of a computing device for performing a method for determining distances between two curved surfaces, the method comprising:

(a) reading information in relation to a first curved surface and a second curved surface from a storage device, meshing the first curved surface into a plurality of first triangles, and meshing the second curved surface into a plurality of second triangles based on the information, wherein the information comprises three-dimensional (3D) models and parametric equations of the two curved surfaces;

(b) dividing a parametric plane associated with the parametric equations into a plurality of first grids, wherein each first grid in the parametric plane corresponds to a small box in 3D space, the small box having a same side length as the first grid;

(c) determining associations between the first/second triangles and the small boxes in the 3D space, wherein the associations comprise whether one small box intersects a first/second triangle or falls within a first/second triangle;

(d) determining a second triangle that is nearest to each first triangle of the first curved surface, and determining a distance between the first triangle and the second triangle as a minimum distance from the first triangle to the second curved surface, wherein step (d) comprises:

(d1) reading a first triangle of the first curved surface;

(d2) determining whether fifth small boxes, which fall within a circumscribed sphere of the first triangle, associate with a second triangle of the second curved surface, determining a second triangle which is nearest to the first triangle and going to step (d5) if a fifth small box associates with the second triangle, or going to step (d3) if all of the fifth small boxes do not associate with any second triangle of the second curved surface;

(d3) determining coordinates of a maximum bounding box of the first triangle according to associations of the first triangle and the fifth small boxes;

(d4) extending the maximum bounding box until a second triangle falls within the extended maximum bounding box;

(d5) determining a distance between the first triangle of the first curved surface and the second triangle of the second curved surface, and regarding the distance as a minimum distance from the first triangle to the second curved surface; and (d6) repeating from step (d1), until the minimum distances from each first triangle of the first curved surface to the second curved surface have been determined; and (e) determining a minimum value from all of the minimum distances as a minimum distance between the first curved surface and the second curved surface.

12. The medium of claim 11, wherein step (b) comprises:

(b1) converting a 3D model of a first curved surface to a B-spline curved surface, determining a closed boundary curve of the B-spline curved surface in the parametric plane, and dividing the closed boundary curve by a plurality of horizontal lines (U-lines) and vertical lines (V-lines), to obtain a plurality of second grids;

(b2) if a second grid has no intersection point with the closed boundary curve, generating two first triangles by connecting four vertices of the second grid anti-clockwise;

(b3) if a second grid has one or more intersection points with the closed boundary curve, adding the one or more intersection points, one or more vertices of the second grid which fall within the closed boundary curve, and boundary points of the closed boundary line into a two-dimensional (2D) data structure Q1;

(b4) reading a first point p1 and a second point p2 nearest to the point p1 from the 2D data structure Q1, wherein p1 and p2 construct one side of a first triangle A1, determining a third point p3 of the first triangle A1 according to a determination rule that there is no 2D point of the 2D data structure Q1 in a circumcircle of the first triangle A1 consisting of the points p1, p2, and p3; and (b5) determining vertices of other first triangles in the 2D data structure Q1 according to the determination rule, to generate the plurality of first triangles of the first curved surface.

13. The medium of claim 11, wherein step (c) comprises:
(c1) reading a first triangle of the first curved surface;
(c2) determining a circumscribed sphere and a maximum bounding box of the first triangle;
(c3) determining first small boxes do not intersect the first triangle and filtering the first small boxes, wherein the first small boxes fall outside of the maximum bounding box;
(c4) determining four distances between a center of the circumscribed sphere and four vertices of each second small box that falls within the maximum bounding box, and determining the second small box does not intersect the first triangle and filtering the second small box, if a minimum distance of the four distances is equal to or more than a radius of the circumscribed sphere;
(c5) determining if each third box, which falls between the first triangle A1 and the maximum bounding box Q1, has an intersection point with the first triangle A1,
(c6) determining a third small box does not intersect with the first triangle and filtering the third boxes, if the third box has no intersection point with the first triangle A1, and setting a first flag in a third small box that has an intersection point with the first triangle;
(c7) setting a second flag in each of fourth small boxes that fall within the first triangle; and
(c8) repeating from step (a1), until the associations between each first triangle of the first curved surface and the small boxes have been determined.

14. The medium of claim 13, wherein the maximum bounding box of the first triangle is defined as a cuboid that surrounds the first triangle, and the first triangle still falls within the cuboid no matter how the first triangle is rotated by taking any point on the first triangle as the pivot point.

15. The medium of claim 11, wherein the method further comprises:
storing data in relation to the associations and the distances into the storage device.

* * * * *